US010341769B1

(12) United States Patent
Ye

(10) Patent No.: US 10,341,769 B1
(45) Date of Patent: Jul. 2, 2019

(54) SOUND AMPLIFICATION SYSTEM INTEGRATED WITH BACK CAVITY PRESSURE SENSING AND AUDIO PLAYER

(71) Applicants: ZILLTEK TECHNOLOGY (SHANGHAI) CORP., Shanghai (CN); ZILLTEK TECHNOLOGY CORP., Hsinchu (TW)

(72) Inventor: Jinghua Ye, Shanghai (CN)

(73) Assignees: ZILLTEK TECHNOLOGY (SHANGHAI) CORP., Shanghai (CN); ZILLTEK TECHNOLOGY CORP., Hsinchu (TW)

( * ) Notice: Subject to any disclaimer, the term of this patent is extended or adjusted under 35 U.S.C. 154(b) by 12 days.

(21) Appl. No.: 15/974,327

(22) Filed: May 8, 2018

(30) Foreign Application Priority Data

Feb. 14, 2018 (CN) .......................... 2018 1 0152033

(51) Int. Cl.

| | |
|---|---|
| ***H03G 11/00*** | (2006.01) |
| ***H04R 3/00*** | (2006.01) |
| ***H04R 29/00*** | (2006.01) |
| ***H04R 7/18*** | (2006.01) |
| ***H04R 7/12*** | (2006.01) |
| *H04R 1/00* | (2006.01) |

(52) U.S. Cl.
CPC ............. *H04R 3/007* (2013.01); *H04R 7/127* (2013.01); *H04R 7/18* (2013.01); *H04R 29/001* (2013.01)

(58) Field of Classification Search
CPC .......... H04R 3/007; H04R 7/127; H04R 7/18; H04R 29/001
USPC .................................................... 381/55, 396
See application file for complete search history.

(56) References Cited

U.S. PATENT DOCUMENTS

| | | | | |
|---|---|---|---|---|
| 2007/0189577 A1* | 8/2007 | Tsuda | H04R 9/027 | 381/415 |
| 2015/0237443 A1* | 8/2015 | Ronig | H04R 3/007 | 381/55 |
| 2015/0304772 A1* | 10/2015 | Risberg | H04R 3/007 | 381/55 |

* cited by examiner

*Primary Examiner* — Xu Mei
*Assistant Examiner* — Ammar T Hamid
(74) *Attorney, Agent, or Firm* — SoCal IP Law Group LLP; Nikki M. Dossman

(57) ABSTRACT

A sound amplification system integrated with back cavity pressure sensing, including: a loudspeaker body, including: a vibrating diaphragm, a voice coil connected with the vibrating diaphragm, and a back cavity, wherein the voice coil is connected to a driving unit, a microphone is in the back cavity, and the microphone senses an internal pressure of the back cavity; a computing unit, making an estimation of a displacement of the vibrating diaphragm based on the internal pressure; and a processing unit, determining the displacement of the vibrating diaphragm when compared with a reference displacement, when it is determined that the displacement exceeds a set threshold, a pre-compensation signal is generated and provided to the driving unit.

7 Claims, 2 Drawing Sheets

SOUND AMPLIFICATION SYSTEM INTEGRATED WITH BACK CAVITY PRESSURE SENSING AND AUDIO PLAYER

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

RELATED APPLICATION INFORMATION

This application claims benefit of priority to Chinese Patent Application No.: 201810152033.6, filed Feb. 14, 2018, of which full contents are incorporated herein by reference.

BACKGROUND

Field of the Invention

The invention relates to the field of audio technology, and more particularly, to a sound amplification system.

Description of the Related Art

A loudspeaker is an electroacoustic transducer which converts an electrical signal into a sound signal, and it is a main component of a sound amplification system. Now, the most widely used type of loudspeaker is the electrodynamic loudspeaker whose working principle is as follows: when an alternating current is applied to its voice coil, the voice coil will be subjected to a force exerted by the magnetic field, which may cause the voice coil to move up and down, and thus to drive a vibrating diaphragm to vibrate, thereby creating sound. The acoustic performance of the loudspeaker is not only related to the structure, the material of the loudspeaker and the manufacturing process, but also to the control of the loudspeaker. However, the performance of the sound amplification system is affected due to the lack of real-time and effective measures.

SUMMARY OF THE INVENTION

In order to solve the above technical problems, the present invention provides a sound amplification system integrated with back cavity pressure sensing, and the detailed solutions are as follows:

A sound amplification system integrated with back cavity pressure sensing, comprising:

a loudspeaker body, comprising: a vibrating diaphragm, a voice coil connected with the vibrating diaphragm, and a back cavity, wherein the voice coil is connected to a driving unit, at least one microphone is disposed in the back cavity, and the microphone senses an internal pressure of the back cavity;

a computing unit, making an estimation of a displacement of the vibrating diaphragm based on the internal pressure; and a processing unit, determining the displacement of the vibrating diaphragm when compared with a reference displacement, when it is determined that the displacement exceeds a set threshold, a pre-compensation signal is generated and provided to the driving unit.

The sound amplification system integrated with back cavity pressure sensing of the present invention, wherein the internal pressure and the displacement of the vibrating diaphragm are closely linked and shown as the following formula:

$$p(s)=X(s)*S/Ca;$$

wherein p(s) is the Laplace transform of the internal pressure of the back cavity;

X(s) is the Laplace transform of the equivalent displacement of the vibrating diaphragm;

s is a Laplace independent variable;

S is an equivalent area of the vibrating diaphragm; and

Ca is a mechanical compliance of the back cavity.

The sound amplification system integrated with back cavity pressure sensing of the present invention, wherein an equivalent circuit of the loudspeaker comprises a primary circuit, and the primary circuit comprises force Fcoil generated by a coil, coil and the vibrating diaphragm velocity v in the circuit, an equivalent inductance of the loudspeaker mass Mms, an equivalent resistance of the loudspeaker resistance Rms, and an equivalent capacitance of the loudspeaker mechanical compliance Cms; and wherein the primary equivalent force of a converter F'=pS, wherein F' is the primary equivalent force of the converter, p is the internal pressure of the back cavity, and S is the equivalent area of the vibrating diaphragm.

The sound amplification system integrated with back cavity pressure sensing of the present invention, wherein the equivalent circuit of the loudspeaker comprises a secondary circuit, and the secondary circuit comprises the equivalent capacitance of the loudspeaker mechanical compliance Ca, and a secondary body velocity U=vS in which U is secondary body velocity, v is the coil and the vibrating diaphragm velocity, and S is the equivalent area of the vibrating diaphragm; and wherein a ratio between the primary circuit and the secondary circuit is S:1.

The sound amplification system integrated with back cavity pressure sensing of the present invention, wherein the loudspeaker body comprises a magnetic conductive column, a magnet being disposed outside a columnar portion of the magnetic conductive column, and a magnetic conductive plate arranged above the magnet; and wherein the voice coil is provided in a gap between the magnetic conductive plate and the columnar portion.

The sound amplification system integrated with back cavity pressure sensing of the present invention, wherein a centering disk, taking the form of a wavy annular folded plate, is provided on the magnetic conductive plate.

The sound amplification system integrated with back cavity pressure sensing of the present invention, wherein the loudspeaker body comprises a support, and the vibrating diaphragm is disposed at the top of the support.

The sound amplification system integrated with back cavity pressure sensing of the present invention, wherein the vibrating diaphragm is cone-shaped, and comprises an evaginable edge at its top, and the evaginable edge is connected to the support by means of a fastening device.

The sound amplification system integrated with back cavity pressure sensing of the present invention, wherein the computing unit and the processing unit are integrated in the same chip.

The invention also provides an audio player, comprising: the above-mentioned sound amplification system integrated with back cavity pressure sensing.

The beneficial effects of the present invention are as follows: in this invention, the back cavity is provided with a microphone, and the internal pressure inside the back cavity can be sensed by the microphone, then performing offset estimation for the vibrating diaphragm based on the internal pressure, and the vibrating diaphragm offset is then used to accurately determine the distortion of the loudspeaker so as to perform pre-compensation. In this way, distortion can be reduced, and the loudspeaker is well protected, finally the performance of the sound amplification system can be ensured.

BRIEF DESCRIPTION OF THE DRAWINGS

The accompanying drawings, together with the specification, illustrate exemplary embodiments of the present disclosure, and, together with the description, serve to explain the principles of the present invention.

DETAILED DESCRIPTION

Figure 1:
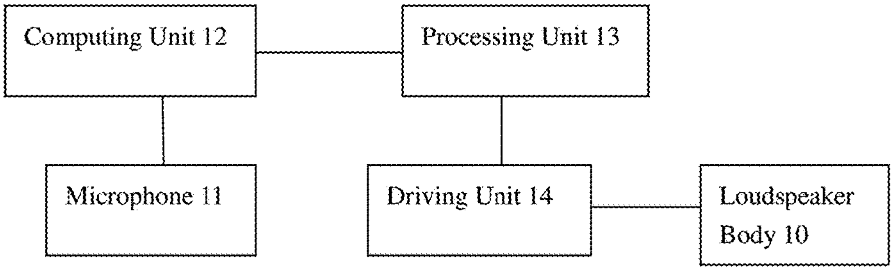
FIG. 1 is a functional block diagram of the present invention.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "plurality" means a number greater than one.

Hereinafter, certain exemplary embodiments according to the present disclosure will be described with reference to the accompanying drawings.

Referring to FIG. 1, a sound amplification system integrated with back cavity pressure sensing, comprising:

a loudspeaker body 10, comprising: a vibrating diaphragm, a voice coil connected with the vibrating diaphragm, and a back cavity, wherein the voice coil is connected to a driving unit 14, at least one microphone 11 is disposed in the back cavity, and the microphone 11 senses an internal pressure of the back cavity;

a computing unit 12, making an estimation of a displacement of the vibrating diaphragm based on the internal pressure; and a processing unit 13, determining the displacement of the vibrating diaphragm when compared with a reference displacement, when it is determined that the displacement exceeds a set threshold, a pre-compensation signal is generated and provided to the driving unit.

In this invention, the back cavity is provided with a microphone, and the internal pressure inside the back cavity can be sensed by the microphone, then performing offset estimation for the vibrating diaphragm based on the internal pressure, and the vibrating diaphragm offset is then used to accurately determine the distortion of the loudspeaker so as to perform pre-compensation. In this way, distortion can be reduced, and the loudspeaker is well protected, finally the performance of the sound amplification system can be ensured.

Figure 2:
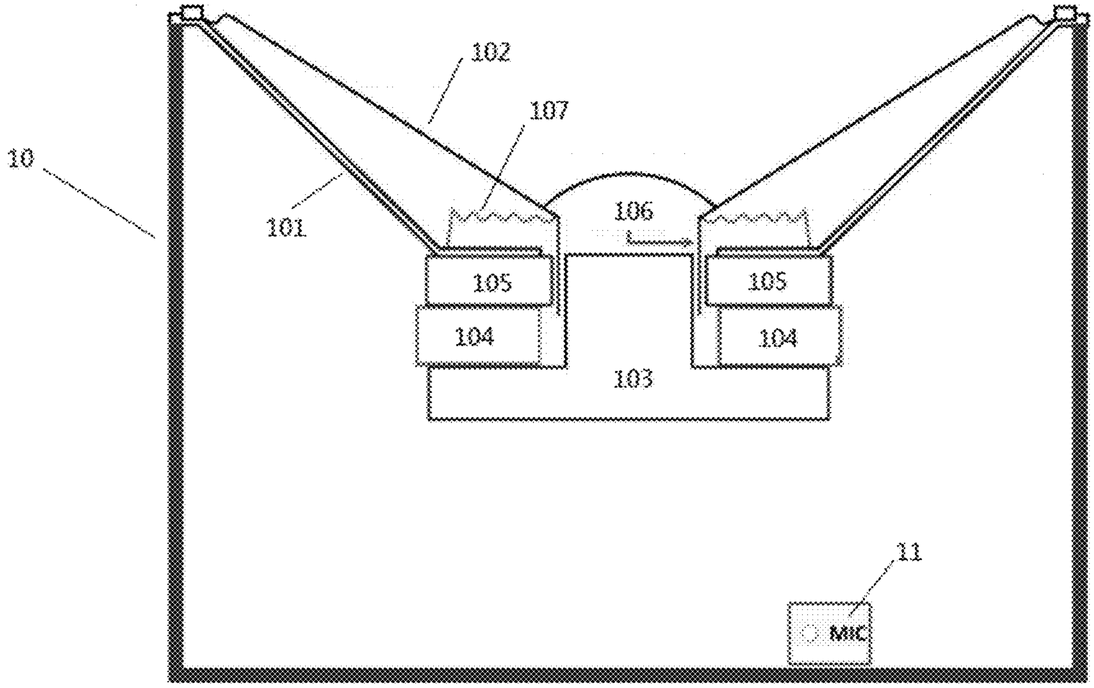
FIG. 2 is a schematic diagram of a mechanical model of the present invention.

The sound amplification system integrated with back cavity pressure sensing of the present invention, referring to FIG. 2, the loudspeaker body 10 may comprise a support 101, and the vibrating diaphragm 102 is disposed at the top of the support 101. The loudspeaker body comprises an inverted-T magnetic conductive column 103, a magnet 104 disposed outside a columnar portion of the inverted-T magnetic conductive column 103, and a magnetic conductive plate 105 arranged above the magnet 104. In addition, the voice coil 106 is provided in a gap between the magnetic conductive plate 105 and the columnar portion. A centering disk 107, taking the form of a wavy annular folded plate, is provided on the magnetic conductive plate 105.

The sound amplification system integrated with back cavity pressure sensing of the present invention, wherein the loudspeaker body 10 comprises a dust cover 108 located above the voice coil 106. The vibrating diaphragm 102 of the present invention is cone-shaped, and comprises an evaginable edge at its top, and the evaginable edge is connected to the support 101 by means of a fastening device.

In the loudspeaker body, a vibration system consists of the vibrating diaphragm 102, the voice coil 106 and the centering disk 107 for holding the voice coil 106 in place in the magnetic gap. Moreover, a magnetic circuit system consists of the inverted-T magnetic conductive column 103, the magnet 104 and the magnetic conductive plate 105. While the support 101, the dust cover 108 and the like refer to auxiliary members.

The loudspeaker body of the present invention is not limited to the above structure.

Figure 3:
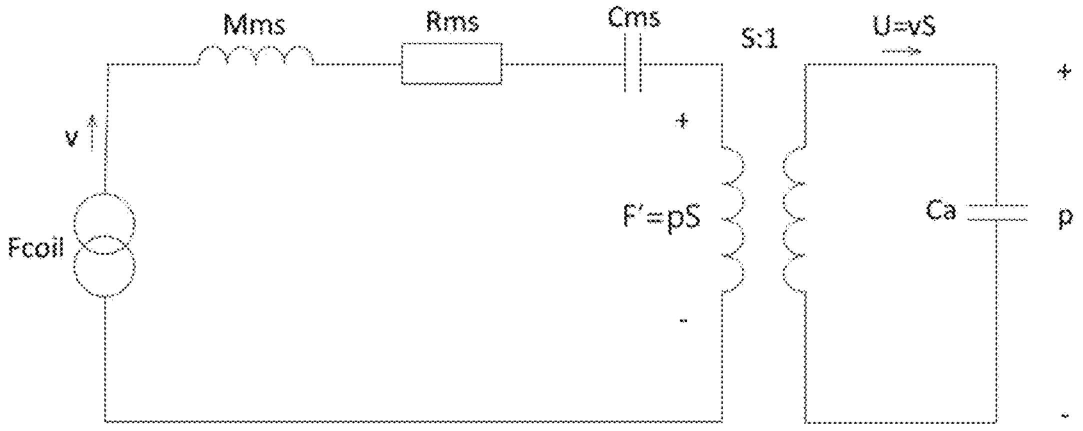
FIG. 3 is a schematic diagram of an equivalent circuit of the present invention.

The equivalent circuit analysis shown in FIG. 3: the equivalent circuit of the loudspeaker comprises a primary circuit, and the primary circuit comprises force Fcoil generated by a coil, coil and the vibrating diaphragm velocity v in the circuit, an equivalent inductance of the loudspeaker mechanical parameters such as mass Mms, an equivalent resistance of the loudspeaker resistance Rms, and an equivalent capacitance of the loudspeaker mechanical compliance Cms; and primary equivalent force of a converter F'=pS, wherein F' is the primary equivalent force of the converter, p is the internal pressure of the back cavity, and S is the equivalent area of the vibrating diaphragm. The equivalent circuit of the loudspeaker comprises a secondary circuit, and the secondary circuit comprises the equivalent capacitance of the loudspeaker mechanical compliance Ca, and a secondary body velocity U=vS wherein U is the secondary body velocity, v is the coil and the vibrating diaphragm velocity, and S is the equivalent area of the vibrating diaphragm; and moreover, a ratio between the primary circuit and the secondary circuit is S:1.

When assuming no loss is found during the transmission of the converter, it can be concluded that:

F'*v=p*U, wherein, F' is the primary equivalent force of the converter; v is the coil and the vibrating diaphragm velocity; P is the pressure of the back cavity; and U is the secondary body velocity;

Secondary pressure is the pressure of the back cavity p(s)=U(s)*(1/sCa)=v(s)*S/sCa, wherein p(s) is the Laplace transform of the internal pressure of the back cavity;

U(s) is the Laplace transform of the secondary body velocity;

s is a Laplace independent variable;

Ca is a mechanical compliance of the back cavity.

Figure 4:
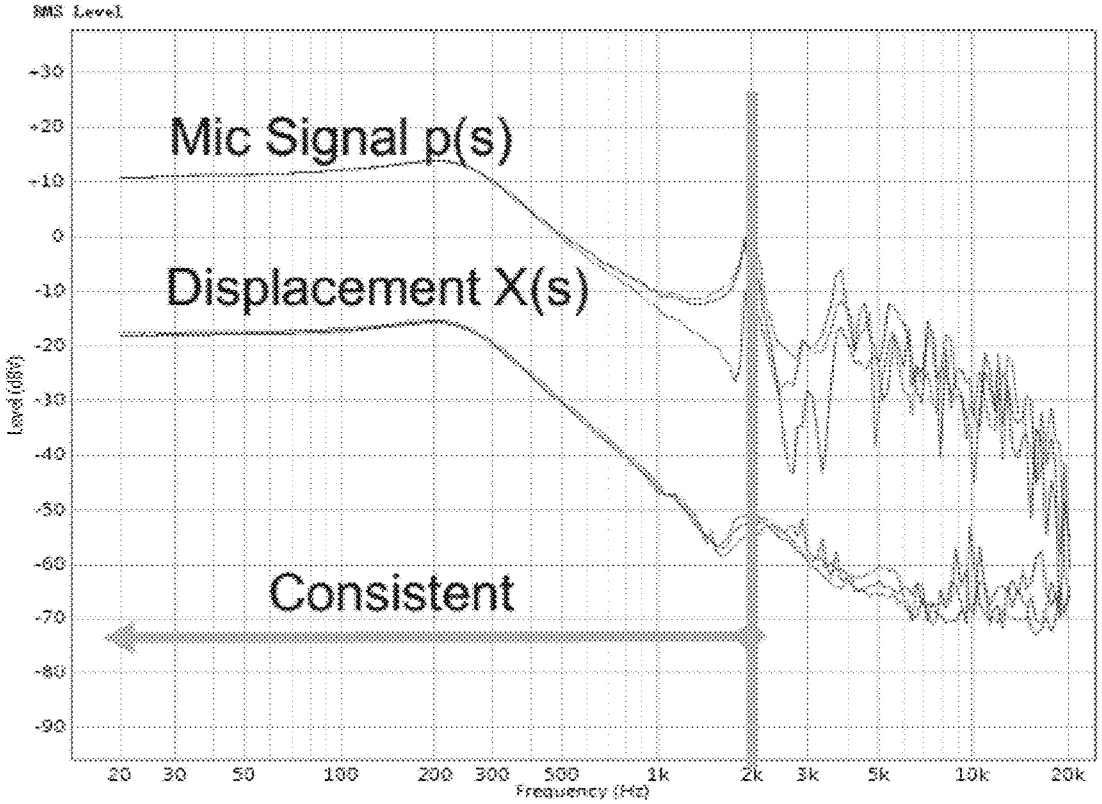
FIG. 4 is a graph showing that the acoustic pressure in the back cavity is proportional to the displacement of the vibrating diaphragm.

V(s) is the Laplace transform of the coil and the vibrating diaphragm velocity; and S is an equivalent area of the vibrating diaphragm;

Due to the formula v(s)=s*X(s), wherein X(s) is the equivalent displacement of the vibrating diaphragm, the above formula can be changed to p(s)=X(s)*S/Ca, that is, when the equivalent area of the vibrating diaphragm and the structure of the back cavity are constant, the sound pressure of the back cavity is proportional to the displacement of the vibrating diaphragm and has the above relationship. Referring to FIG. 4, the experimental data further demonstrates the above relationship.

In the invention, the pressure of the back cavity is sensed by a microphone provided in the sealed back cavity, and the displacement of the vibrating diaphragm is estimated based upon the pressure of the back cavity according to the above relationship. Based on the integrated back cavity pressure sensing and simplified problems, the technical solution of the invention can be implemented in a simple way, and the acoustic performance of the sound amplification system can be improved effectively through the above solution. The above reference displacement and the set threshold can be selected and set according to actual conditions, and stored in a memory.

More than one microphone of the invention can be disposed in the back cavity, such that accuracy of the test and be ensured, and pre-compensation can be performed accurately. The position of the microphone of the invention in the back cavity and the distance between the microphones can be adjusted according to actual needs and test results.

A digital microphone is adopted as the above microphone, preferably a MEMS microphone.

The above pre-compensation signal can be an incremental signal or a decrement signal to change the current for driving the voice coil. The above pre-compensation signal may also be a gain adjustment signal to change the gain of the driving unit. Those skilled in the art can select the pre-compensation signal based on the prior art according to the purpose of adjustment. The above processing unit 13 and the computing unit 12 may be integrated in the same chip, such as in a digital signal processing chip integrated with multiple functions.

The invention also provides an audio player, comprising: the above sound amplification system integrated with back cavity pressure sensing. The audio player can be an intelligent speaker, an intelligent interactive robot or parts for audio playing of other intelligent home appliances.

The above descriptions are only the preferred embodiments of the invention, not thus limiting the embodiments and scope of the invention. Those skilled in the art should be able to realize that the schemes obtained from the content of specification and drawings of the invention are within the scope of the invention.

It is claimed:

1. A sound amplification system integrated with back cavity pressure sensing, comprising:

a loudspeaker body, comprising: a vibrating diaphragm, a voice coil connected with the vibrating diaphragm, and a back cavity, wherein the voice coil is connected to a driving unit, at least one microphone is disposed in the back cavity, and the microphone senses an internal pressure of the back cavity;

a computing unit, making an estimation of a displacement of the vibrating diaphragm based on the internal pressure; and a processing unit, determining the displacement of the vibrating diaphragm when compared with a reference displacement, when it is determined that the displacement exceeds a set threshold, a pre-compensation signal is generated and provided to the driving unit;

wherein the internal pressure and the displacement of the vibrating diaphragm are closely linked and shown as the following formula:

$$p(s)=X(s)*S/Ca;$$

wherein p(s) is the Laplace transform of the internal pressure of the back cavity;

X(s) is the Laplace transform of the equivalent displacement of the vibrating diaphragm;

s is a Laplace independent variable;

S is an equivalent area of the vibrating diaphragm; and

Ca is a mechanical compliance of the back cavity;

wherein an equivalent circuit of the loudspeaker comprises a primary circuit, and the primary circuit comprises force Fcoil generated by a coil, the coil and the vibrating diaphragm velocity v in the circuit, an equivalent inductance of the loudspeaker mass Mms, an equivalent resistance of the loudspeaker resistance Rms, and an equivalent capacitance of the loudspeaker mechanical compliance Cms; and wherein primary equivalent force of a converter F'=pS, wherein F' is the primary equivalent force of the converter, p is the internal pressure of the back cavity, and S is the equivalent area of the vibrating diaphragm; and the equivalent circuit of the loudspeaker further comprises a secondary circuit, and the secondary circuit comprises the equivalent capacitance of the loudspeaker mechanical compliance Ca, and a secondary body velocity U=vS in which U is secondary body velocity, v is the coil and the vibrating diaphragm velocity, and S is the equivalent area of the vibrating diaphragm; and wherein a ratio between the primary circuit and the secondary circuit is S:1.

2. The sound amplification system integrated with back cavity pressure sensing of claim 1, wherein the loudspeaker body comprises a magnetic conductive column, a magnet being disposed outside a columnar portion of the magnetic conductive column, and a magnetic conductive plate arranged above the magnet; and wherein the voice coil is provided in a gap between the magnetic conductive plate and the columnar portion.

3. The sound amplification system integrated with back cavity pressure sensing of claim 1, wherein a centering disk, taking the form of a wavy annular folded plate, is provided on the magnetic conductive plate.

4. The sound amplification system integrated with back cavity pressure sensing of claim 1, wherein the loudspeaker body comprises a support, and the vibrating diaphragm is disposed at the top of the support.

5. The sound amplification system integrated with back cavity pressure sensing of claim 4, wherein the vibrating diaphragm is cone-shaped, and comprises an evaginable edge at its top, and the evaginable edge is connected to the support by means of a fastening device.

6. The sound amplification system integrated with back cavity pressure sensing of claim 1, wherein the computing unit and the processing unit are integrated in the same chip.

7. An audio player, comprising: the sound amplification system integrated with back cavity pressure sensing of claim 1.

* * * * *